United States Patent
Pei

(10) Patent No.: US 10,069,484 B2
(45) Date of Patent: Sep. 4, 2018

(54) MOBILE TERMINAL AND A NETWORK SEARCHING METHOD FOR OVERCOMING CRYSTAL AGING ISSUE

(71) Applicant: MediaTek Singapore Pte. Ltd., Singapore (SG)

(72) Inventor: Weiwei Pei, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/696,235

(22) Filed: Sep. 6, 2017

(65) Prior Publication Data
US 2018/0076796 A1  Mar. 15, 2018

(30) Foreign Application Priority Data
Sep. 9, 2016 (CN) .......................... 2016 1 0814714

(51) Int. Cl.
  *H03J 3/18* (2006.01)
(52) U.S. Cl.
  CPC .................................... *H03J 3/185* (2013.01)
(58) Field of Classification Search
  CPC ....................................................... H03J 3/185
  See application file for complete search history.

(56) References Cited

U.S. PATENT DOCUMENTS

| | | | |
|---|---|---|---|
| 7,728,684 B2 * | 6/2010 | Tozer ...................... | H03L 1/026 331/158 |
| 8,674,778 B2 * | 3/2014 | Nicholls ................. | H03L 1/022 331/158 |

* cited by examiner

*Primary Examiner* — Jeffrey Zweizig
(74) *Attorney, Agent, or Firm* — McClure, Qualey & Rodack, LLP

(57) ABSTRACT

This invention provides a mobile terminal and a network searching method for overcoming crystal aging issue. The method includes the step of: searching network by invoking parameters stored in a first area of a volatile RAM; if the searching is failed, searching network by invoking parameters stored in a second area of the volatile RAM; if the searching is failed and the number of network searches is larger than a first predetermined value, reacquiring parameters and searching network; if the searching is succeeded, updating the parameters in the first area with the reacquired parameters. By this method, the invention can effectively solve the problems caused by crystal aging or defective crystals, and increases the robustness of the network searching.

12 Claims, 3 Drawing Sheets

MOBILE TERMINAL AND A NETWORK SEARCHING METHOD FOR OVERCOMING CRYSTAL AGING ISSUE

CROSS REFERENCE TO RELATED APPLICATIONS

This Application claims priority of China Patent Application No. 201610814714.5, filed on Sep. 9, 2016, the entirety of which is incorporated by reference herein.

BACKGROUND OF THE INVENTION

Field of the Invention

The invention generally relates to a technology for overcoming the crystal aging problem of the mobile terminal, and more particularly, to a mobile terminal and a network searching method for overcoming crystal aging issue.

Description of the Related Art

In the production, sale and using process (such as a flash ROM recovery operation, etc.) of users for mobile terminals, the radio frequency indexes of the mobile terminals, especially for the frequency accuracy index caused by crystal aging, are changed according to the user's application environment and service time. On the client terminal, it may not be easy to perceive changing in other indexes, and those indexes do not affect the normal communication capabilities of the mobile terminals. However, once the frequency accuracy becomes abnormal, the mobile terminals may lose their communication capabilities, such that the user experience, brand influence and after-sales service will have a negative impact.

Currently, parameters of the mobile terminal are calibrated once at factory, and any subsequent operation cannot destroy these parameters. Some manufacturers may also require writing configuration parameters (that is, the golden parameters) into codes of the mobile terminal. Even if these parameters are lost (such as flash ROM recovery operation errors and so on), the settings in the codes can be invoked to basically guarantee that the functions of the mobile terminal are ok and there is no need to return to the factory.

However, the frequency accuracy may have frequency deviation with the aging of the crystal, and neither calibration nor integration of the golden parameters can completely avoid the probability of failure. Due to the increase of time or the consistency of the crystal itself, the probability of abnormality may be increased. Current solution to such problem is to return the mobile terminal to the factory and disassemble the mobile terminal to use equipment for calibration, thereby consuming a lot of manpower and material resources.

BRIEF SUMMARY OF THE INVENTION

Accordingly, embodiments of the invention provide a mobile terminal and a network searching method for overcoming crystal aging issue, which can effectively solve the problem that the network searching cannot be performed caused by the crystal aging or the crystal batch badness, thereby expanding the network searching application scenarios.

An embodiment of the present invention provides a network searching method for overcoming crystal aging issue, comprising: searching a network by invoking parameters stored in a first area of a volatile RAM; if the network searching is failed, searching the network by invoking parameters stored in a second area of the volatile RAM; if the network searching is failed and the number of network searches is larger than a first predetermined value, reacquiring parameters and searching network; and if the network searching is succeeded, updating the parameters in the first area with the reacquired parameters.

Wherein, initial values of the parameters stored in the first area are the same as the parameters stored in the second area.

Wherein, the parameters comprise a capacitance of a capacitance array and a capacitance of a varactor diode, and changing the capacitance of the capacitance array for coarse adjustment of the parameters; changing the capacitance of the varactor diode is used to fine-tune the parameters.

Wherein, the step of reacquiring the parameters and searching the network comprises: adjusting the capacitance of the capacitor array at a preset step and performing the network searching to minimize the frequency error; and calibrating the capacitance of the varactor diode and performing the network searching so that the frequency error approaches zero.

Wherein the step of calibrating the capacitance of the varactor diode comprises: adjusting the value in the middle of a variation range for the capacitance of the varactor diode to be located in the middle position of the variation range if a difference between the value of the capacitance of the varactor diode and the value in the middle of the variation range for the capacitance of the varactor diode has exceeded a predetermined range.

Wherein, if searching the network by invoking the parameters stored in the second area of the volatile RAM is succeeded, the parameters of the first area are updated to the parameters of the second area.

Another embodiment of the present invention provides a mobile terminal, comprising: a first network searching module configured to search a network by invoking parameters stored in a first area of a volatile RAM; a second network searching module connected to the first network searching module for searching the network by invoking parameters stored in a second area of the volatile RAM if the network searching is failed; a third network searching module connected to the second network searching module for reacquiring parameters and searching the network if the network searching is failed and the number of network searches is larger than a first predetermined value; and a parameter updating module connected to the third network searching module for updating the parameters in the first area with the reacquired parameters if the searching is succeeded.

Wherein, initial values of the parameters stored in the first area are the same as the parameters stored in the second area.

Wherein, the parameters comprise a capacitance of a capacitance array and a capacitance of a varactor diode, and the capacitance of the capacitance array is changed to perform coarse adjustment of the parameters while the capacitance of the varactor diode is changed to fine-tune the parameters.

Wherein, the third network searching module is further configured to: adjust the capacitance of the capacitor array at a preset step and perform the network searching to minimize the frequency error; calibrate the capacitance of the varactor diode and perform the network searching so that the frequency error approaches zero.

Wherein, the third network searching module is further configured to: adjust the value in the middle of a variation range for the capacitance of the varactor diode to be located in the middle position of the variation range if a difference between the value of the capacitance of the varactor diode and the value in the middle of the variation range for the capacitance of the varactor diode has exceeded a predetermined range.

Wherein, the parameter updating module is further configured to: update the parameters of the first area to the parameters of the second area if searching the network by invoking the parameters stored in the second area of the volatile RAM is succeeded.

The beneficial effects of the embodiments are: this invention searching the network by invoking parameters stored in a first area of a volatile RAM; if the searching is failed, searching network by invoking parameters stored in a second area of the volatile RAM; if the searching is failed and the number of network searches is larger than a predetermined value, reacquiring parameters and searching network; if the searching is succeeded, updating the parameters in the first area with the reacquired parameters. By this method, the invention can effectively solve the problems caused by crystal aging or defective crystals, and increases the robustness of the network searching which can effectively solve the problem that the network searching cannot be performed caused by the crystal aging or the crystal batch badness, thereby expanding the network searching application scenarios.

BRIEF DESCRIPTION OF DRAWINGS

In order to more clearly illustrate the technical solutions of the embodiments of the present invention, the drawings which are required to be used in the description of the embodiments will be briefly described below, and it will be apparent that the drawings described below are only some of the present invention It will be apparent to those skilled in the art that other drawings may be obtained without departing from the scope of the inventive work in accordance with these drawings, wherein.

DETAILED DESCRIPTION OF THE INVENTION

The present invention will now be combined with the implementation of the accompanying drawings, were clear examples of technical solutions of the present invention, fully described, it is clear that the described embodiments are merely part of the embodiments of the present invention, but not all embodiments. Based on the embodiments of the present invention, all other embodiments of the ordinary skilled in the art without creative efforts shall be made available, are within the scope of the present invention protected.

Figure 1:
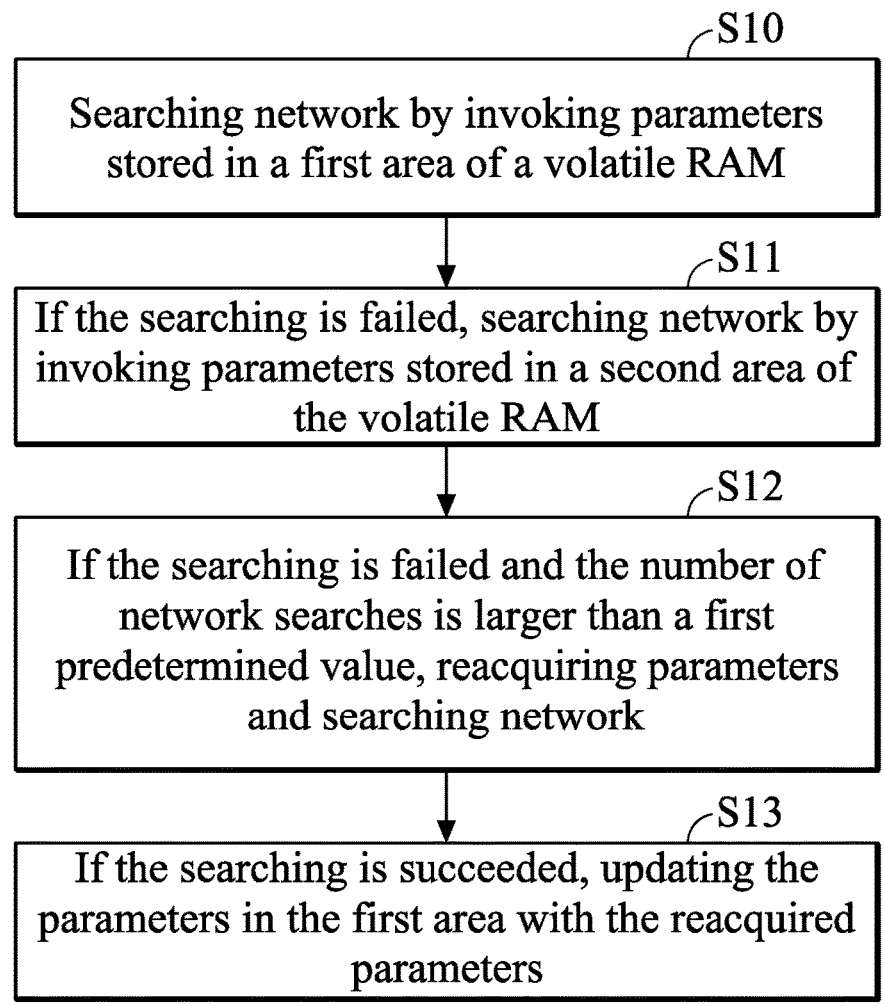
FIG. 1 is a flowchart of a network searching method for overcoming crystal aging issue according to the first embodiment of the invention.

FIG. 1 is a flowchart of a network searching method for overcoming crystal aging issue according to the first embodiment of the invention. As shown in FIG. 1, the network searching method for overcoming crystal aging issue comprises the steps of:

Step S10: searching network by invoking parameters stored in a first area of a volatile RAM.

In the embodiment of the present invention, the parameters are automatic frequency control (AFC) parameter, which influences the frequency accuracy of the mobile terminal, and thus further influences the network searching of the mobile terminal. Controlling the frequency accuracy of the mobile terminal can be achieved by changing the load capacitance of the crystal, which can be changed in two ways: changing the capacitance of the capacitor array (CAPID) or changing the capacitance of the varactor diode (AFC DAC). Thus, the parameters include the capacitance of the CAPID and the capacitance of the AFC DAC. Wherein, the capacitance of the CAPID is changed for coarse tuning the parameters; and the capacitance of the AFC DAC is changed for fine tuning parameters. The accuracy of the first capacitance parameter is preferably 0.25 ppm/CAPID, and the corresponding range is preferably from 0 to 255. The accuracy of the capacitance of the AFC DAC is preferably 0.008 ppm/DAC, and the corresponding range is preferably from 0 to 8191.

In the embodiment of the present invention, the first area in the volatile random access memory (RAM) stores the temporary capacitance of the CAPID and the temporary capacitance of the AFC DAC, and the values of which can be changed according to the result of the network searching.

Step S11: if the network searching is failed, the network is searched by invoking parameters stored in a second area of the volatile RAM.

In the embodiment of the present invention, the second area in the volatile RAM stores the capacitance of the capacitance array (CAPID) and the capacitance of the varactor diode (AFC DAC) when the mobile terminal is shipped, and the value thereof cannot be changed according to the result of the network searching. Therefore, calibration data loss scenario caused by user operation such as flash ROM recovery operation and others can be overcome.

The mobile terminal needs to calibrate the capacitance of the capacitor array (CAPID) and the capacitance of the varactor diode (AFC DAC) at the factory. Specifically, the capacitance of the AFC DAC is first fixed, and the capacitance of the CAPID is calibrated to minimize the frequency error, and the calibrated capacitance of the CAPID is recorded; then, the capacitance of the CAPID is fixed and the capacitance of the AFC DAC is calibrated such that the frequency error approaches zero, and the calibrated capacitance of the AFC DAC is recorded; then the calibrated capacitance of the CAPID and the calibrated capacitance of the AFC DAC are stored in a second area in the volatile RAM.

Initial values of the capacitance of the CAPID and the capacitance of the AFC DAC stored in the first area are the same as the capacitance of the CAPID and the capacitance of the AFC DAC stored in the second area.

The capacitance of the capacitance array and the capacitance of the varactor stored in the first region are the same as the capacitance of the capacitance array and the capacitance of the varactor stored in the second region.

Step S12: if the number of network searches is larger than a first predetermined value, parameters are reacquired and network is again searched.

In the embodiment of the present invention, the network searching is performed with the parameters stored in the second area of the volatile RAM. If the network searching is succeeded, the parameters in the first area of the volatile RAM are updated with the reacquired parameters for the network searching, that is, the parameters of the second area. If the network searching is failed, the counting is started and when the number of network searches is larger than the first predetermined value, searching network by using the parameters of the second area stored in the volatile random access memory is stopped, and the parameters are reacquired and the network is searched again.

Specifically, the network searching is performed by using the capacitance of the CAPID adjusted at a preset step to minimize the frequency error; and the capacitance of the AFC DAC is calibrated and the network searching is performed so that the frequency error approaches zero. In the embodiment of the present invention, the smaller the step size of the capacitance of the CAPID is, the longer the time spends and the higher probability of finding the network. Correspondingly, the larger the step size of the capacitance of the CAPID is, the shorter the time spends and the lower probability of find the network. Taking a Global System for Mobile Communication (GSM) network as an example, as the frequency error that the GSM may demodulate can be 27 KHz, for GSM900 is 30 PPM and the Distributed control system (DCS) is 15 PPM. The effect on the frequency for each CAPID is 0.25 PPM, so the interval can be considered to be 60 CAPIDs. To retain a certain margin, the capacitance of the CAPID can be determined between 30 and 40 CAPIDs. In the embodiment of the present invention, the reason why the GSM network is selected for network searching is that the domestic mobile phone has GSM network, and the GSM network can demodulate the signal with larger frequency error.

In the embodiment of the present invention, it is preferred to traverse the GSM network for network searching with a CAPID=45/90/135/180/225, i.e., adjusting the capacitance of the capacitor array with a step of 45 to search network, and the number of network searches is cleared to zero. Then, the capacitance of the capacitance array with minimized frequency error is obtained.

When the capacitance of the varactor diode is calibrated, if a difference between the value of the capacitance of the varactor diode and the middle value of the variation range for the capacitance of the varactor diode has exceeded a predetermined range, the middle value of the variation range for the capacitance of the varactor diode is adjusted to be located in the middle position of the variation range. For example, in an embodiment where the network is GSM, the frequency error of the 30 AFC DAC is approximately equal to the frequency error of 1CAPID, and the middle value of the variation range for the capacitance of the varactor diode, i.e., the center value of the AFC DAC, is 4500. If the absolute value of the AFC DAC-4500 exceeds the preset range of 200, the conversion is automatically performed to ensure that the AFC DAC is in the center position.

Step S13: if the network searching is succeeded, the parameters of the first area are updated to the reacquired parameters.

In step S13, if the network searching is succeeded, i.e., the mobile terminal is capable of dialing or answering a call, or capable of making a data connection, these indicate that the mobile terminal is operating normally, therefore the reacquired capacitances of the capacitor array and the varactor diode are valid, so that they can be used as a reference for the next network searching. Hence, the parameters in the first area are updated to the reacquired parameters, so that when the next network searching starts, the reacquired parameters can be directly applied to perform the network searching, to overcome slow network search speed that caused by the crystal aging issue and inability to search the network due to bad batches of crystals and instability of crystals. In addition, the low-end functional machine has the characteristics of large shipments and low user requirements, calibration may spend a lot of time, manpower and equipment costs. The parameters of the mobile terminal can be cured within the mobile terminal, but the parameter consistency is poor, which may lead to probability of the individual differences. Through the above method, the actual network can be applied to calibrate the mobile terminal, thereby saving a lot of cost.

Figure 2:
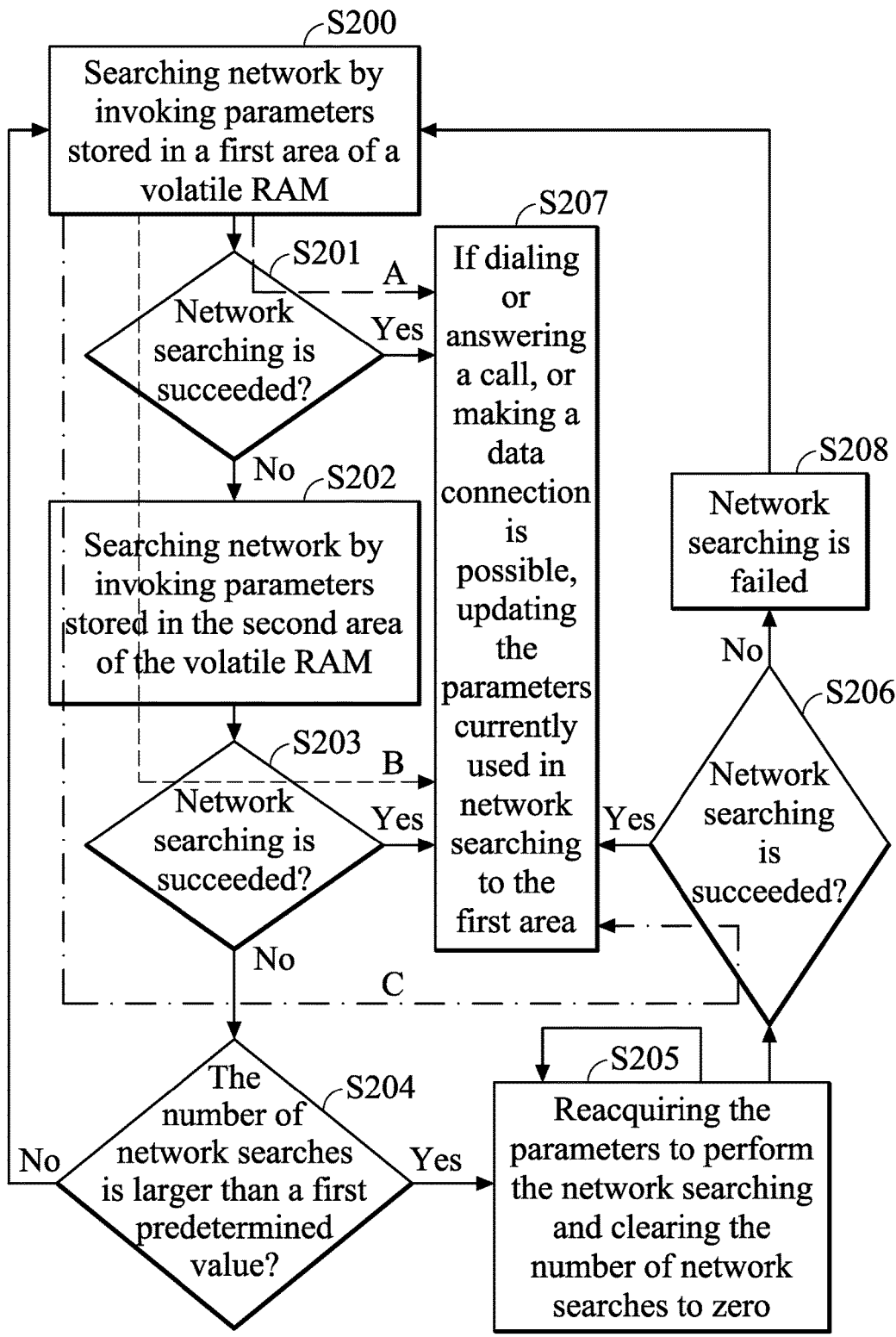
FIG. 2 is a flowchart of a network searching method for overcoming crystal aging issue according to the second embodiment of the invention.

In more detail, referring to FIG. 2, the network searching method for overcoming crystal aging issue comprises the steps of:

Step S200: searching network by invoking parameters stored in a first area of a volatile RAM.

The parameters include the capacitance of the CAPID and the capacitance of the AFC DAC. Wherein, the capacitance of the CAPID is changed for coarse tuning the parameters; and the capacitance of the AFC DAC is changed for fine tuning parameters. The first area in the volatile RAM stores the temporary capacitance of the CAPID and the temporary capacitance of the AFC DAC, and the values of which can be changed according to the result of the network searching. The second area in the volatile RAM stores the capacitance of the CAPID and the capacitance of the AFC DAC when the mobile terminal is shipped, and the value thereof cannot be changed according to the result of the network searching. When the mobile terminal is shipped from the factory, the initial values of the parameters stored in the first area of the volatile RAM are the same as the capacitance of the CAPID and the capacitance of the AFC DAC stored in the second area of the volatile RAM.

Step S201: it is determined whether the network searching is succeeded. If so, the process proceeds to step S207; if not, step S202 is performed.

In the embodiment of the present invention, if the network searching is succeeded by only invoking the parameters of the first area stored in the volatile RAM to search network once, the network searching path A thereof is the most commonly used path, which utilizes the original algorithm of the mobile terminal.

Step S202: the network is searched by invoking parameters stored in the second area of the volatile RAM.

In the embodiment of the present invention, the network searching path B is the network searching failure at the first time by invoking the parameters stored in the first area of the volatile RAM and then the network searching succeeded by invoking the parameters stored in the second area of the volatile RAM, so that the path B is a supplement to the path A, whose function is the same as the original algorithm of the mobile terminal.

Step S203: it is determined whether the network searching is succeeded. If so, the process proceeds to step S207; if not, step S204 is performed.

In the embodiment of the present invention, if the search fails, a counter is also initiated to count the number of times the parameters stored in the second area of the volatile RAM being invoked for the network searching.

Step S204: it is then determined whether the number of network searches is larger than a first predetermined value. If so, step S205 is performed; if not, the process proceeds to step S200.

If the number of network searches is less than the first predetermined value, the process returns to step S200, in which the parameters of the first area and the second area stored in the volatile RAM are successively re-invoked for network searching until the search succeeds or the number of network searches is larger than the first predetermined value.

Step S205: the parameters are reacquired to perform the network searching and the number of network searches is cleared to zero.

In step S205, the capacitance of the capacitor array is adjusted at a preset step to perform the network searching so as to minimize the frequency error; and the capacitance of the varactor diode is calibrated and the network searching is performed so that the frequency error approaches zero.

In the embodiment of the present invention, the smaller the step size of the capacitance of the CAPID is, the longer the time spends and the higher the probability of finding the network is. Correspondingly, the larger the step size of the capacitance of the CAPID is, the shorter the time spends and the lower the probability of find the network is. Preferably, the GSM network is traversed for network searching with a CAP ID=45/90/135/180/225, i.e., adjusting the capacitance of the capacitor array with a step 45 to search network, to obtain the capacitance of the capacitance array at which the frequency error is minimized and the number of network searches is cleared to zero at the same time.

After the capacitance of the capacitance array with the smallest frequency error has been determined, the capacitance of the varactor diode is calibrated and the search is performed so that the frequency error approaches zero. If the difference between the value of the capacitance of the varactor diode and the middle value of the variation range for the capacitance of the varactor diode has exceeded a predetermined range when the capacitance of the varactor diode is calibrated, the middle value of the variation range for the capacitance of the varactor diode is adjusted to be located in the middle position of the variation range.

In the embodiment of the present invention, the path C is that when the parameters of the first area and the second area stored in the volatile RAM are successively re-invoked for network searching for a number of failed network searches and then the parameters are reacquired for subsequent network searching. After the crystal has been aged to a certain level or RF parameters have been cleared, the path C will be used to overcome the calibration data loss scenario caused by user operation such as flash ROM recovery operation and others and to overcome the scenario that the crystal aging issue caused by the application environment which leads to slow search network speed.

Step S206: it is determined whether the network searching is succeeded. If so, step S207 is performed; if not, the process proceeds to step S208.

Step S207: if it is possible to dial or answer a call, or a data connection can be made, the parameters currently used in network searching are updated to the first area.

In the embodiment of the present invention, if the mobile terminal is capable of dialing or answering a call, or capable of making a data connection, then it indicates that the mobile terminal is operating normally. At this time, the parameters currently used in network searching, namely, i.e., the capacitances of the capacitor array and the varactor diode are valid, so that they can be used as a reference to the next network searching. Therefore, the reacquired parameters can be directly applied to perform the network searching when the next network searching starts, so as to overcome the scenario that the crystal aging issue caused by the application environment which leads to slow search network speed and the scenario that the user cannot search the network due to bad batches of crystals and instability of crystals. In addition, the low-end functional machine has the characteristics of large shipments and fewer user requirements, calibration may spend a lot of time, manpower and equipment costs. The parameters of the mobile terminal can be cured within the mobile terminal, but the parameter consistency is poor, which may lead to probability of the individual differences. Through the above method, the actual network can be applied to calibrate the mobile terminal, thereby saving a lot of cost.

Step S208: the network searching is failed. The process returns to step S200.

In step S208, the network searching is failed, indicating that the current round of search is completed, and the process returns to step S200 to start a new round of search.

Figure 3:
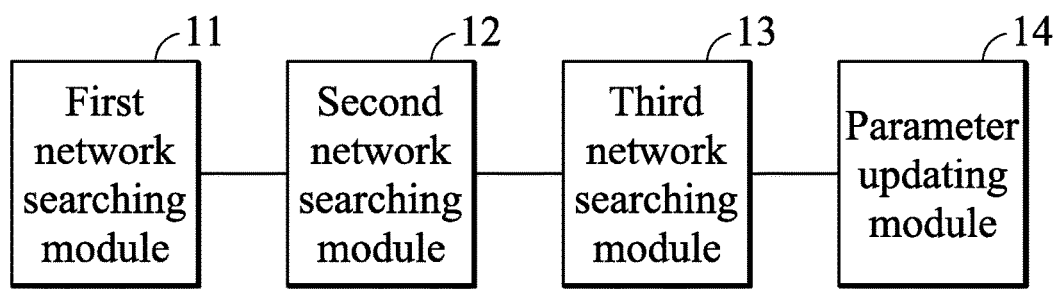
FIG. 3 is a schematic diagram illustrating a structure of a mobile terminal according to an embodiment of the present invention.

FIG. 3 is a schematic diagram illustrating a structure of a mobile terminal according to an embodiment of the present invention. As shown in FIG. 3, the mobile terminal 10 includes a first network searching module 11, a second network searching module 12, a third network searching module 13 and a parameter updating module 14. The first network searching module 11 is configured to search a network by invoking parameters stored in a first area of the volatile RAM. The second network searching module 12 is connected to the first network searching module 11 for searching the network by invoking parameters stored in a second area of the volatile RAM if the network searching by the first network searching module 11 is failed. The third network searching module 13 is connected to the second network searching module 12 for reacquiring parameters and searching the network if the network searching by the first network searching module 11 and the second network searching module 12 are failed and the number of network searches is larger than a first predetermined value. The parameter updating module 14 is connected to the third network searching module 13 for updating the parameters in the first area with the reacquired parameters if the searching by the second network searching module 12 or the third network searching module 13 is succeeded.

It should be understood that each of the elements or modules in the present embodiments, such as the first network searching module 11, the second network searching module 12, the third network searching module 13 and the parameter updating module 14, may be a device with appropriate hardware circuits or elements to perform the corresponding functions, however, the device is not limited to be an entity device, it can also be a virtual device having program and software with respective functions or a device having capabilities for executing the program and software.

In the embodiment of the present invention, the parameter is an automatic frequency control parameter, which can influence the frequency accuracy of the mobile terminal, thereby influencing the searching of the mobile terminal. The accuracy of controlling the frequency of the mobile terminal is achieved by varying the load capacitance of the crystal, which can be changed in two ways: changing the capacitance of the capacitor array or changing the capacitance of the varactor. Thus, the parameters include the capacitance of the capacitor array and the capacitance of the varactor diode. Wherein the capacitance of the capacitance array is changed for a coarse tuning parameter; and the capacitance of the varactor diode is changed for fine tuning parameters.

In the embodiment of the present invention, the first area in the volatile RAM stores the temporary capacitance of the CAPID and the temporary capacitance of the AFC DAC, and the values of which can be changed according to the result of the network searching. The second area in the volatile RAM stores the capacitance of the CAPID and the capacitance of the AFC DAC when the mobile terminal is shipped, and the value thereof cannot be changed according to the result of the network searching. When the mobile terminal is shipped from the factory, the initial values of the parameters stored in the first area of the volatile RAM are the same as the capacitance of the CAPID and the capacitance of the AFC DAC stored in the second area of the volatile RAM.

In the embodiment of the present invention, the parameter updating module 14 is further configured to: update the parameters of the first area with the parameters in the second area if the second network searching module 12 invokes the parameter stored in the second area for performing the network searching and the network searching is succeeded. If the network searching of the second network searching module 12 is failed, the counting is started and when the number of network searches is larger than the first predetermined value, searching network by using the parameters of the second area stored in the volatile RAM is stopped, and the third network searching module 13 is started to reacquire the parameters and search the network again.

Specifically, the third network searching module 13 is configured to: perform the network searching by using the capacitance of the CAPID adjusted at a preset step to minimize the frequency error; and calibrate the capacitance of the AFC DAC and perform the network searching so that the frequency error approaches zero. In the embodiment of the present invention, the smaller the step size of the capacitance of the CAPID is, the longer the time spends and the higher the probability of finding the network is for the third network searching module 13. Correspondingly, the larger the step size of the capacitance of the CAPID is, the shorter the time spends and the lower the probability of find the network is for the third network searching module 13. Preferably, the third network searching module 13 may traverse the GSM network for network searching with a CAP ID=45/90/135/180/225, i.e., adjusting the capacitance of the capacitor array with a step of 45 to search network, and the number of network searches is cleared to zero. Then, the third network searching module 13 may obtain the capacitance of the capacitance array at which the frequency error is minimized.

When the capacitance of the varactor diode is calibrated by the third network searching module 13, the third network searching module 13 is further configured to: adjust the middle value of the variation range for the capacitance of the varactor diode to be located in the middle position of the variation range if a difference between the value of the capacitance of the varactor diode and the middle value of the variation range for the capacitance of the varactor diode has exceeded a predetermined range.

In the embodiment of the present invention, if the network searching performed by the third network searching module 13 is succeeded, i.e., the mobile terminal is capable of dialing or answering a call, or capable of making a data connection, then it indicates that the mobile terminal is operating normally, and the reacquired capacitances of the capacitor array and the varactor diode by the third network searching module 13 are valid, so that they can be used as a reference to the next network searching. Therefore, the parameter updating module 14 updates the parameters in the first area to the reacquired parameters, so that when the next network searching starts, the reacquired parameters can be directly applied to perform the network searching, to overcome the scenario that the crystal aging issue caused by the user environment which leads to slow search network speed and the scenario that the user cannot search the network due to bad batches of crystals and instability of crystals. In addition, the low-end functional machine has the characteristics of large shipments and fewer user requirements, calibration may spend a lot of time, manpower and equipment costs. The parameters of the mobile terminal can be cured within the mobile terminal, but the parameter consistency is poor, which may lead to probability of the monomer anomalies. Through the above method, the actual network can be applied to calibrate the mobile terminal, thereby saving a lot of cost.

In summary, the present invention first searches a network by invoking parameters stored in a first area of a volatile RAM; if the searching is failed, searches network by invoking parameters stored in a second area of the volatile RAM; if the number of network searches is larger than a first predetermined value, reacquires parameters and performs the network searching; if the searching is succeeded, updates the parameters in the first area with the reacquired parameters, thus effectively solving the problems that the network searching cannot be performed caused by the crystal aging or the crystal batch defects, thereby enhancing the network searching application abilities.

It should be understood by those who are skilled in this technology that: all or some of the steps in the above-described methods of the embodiments may be implemented by a program instructions related hardware. The program may be stored in a computer readable storage medium. When the program is being executed, each of the steps in the above-described method embodiments can be performed; and the aforementioned storage medium may include: any medium capable of storing the program codes, such as ROM, RAM, disk, or optical disk and so on.

Methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other forms of transmission, wherein, when the program code is received and loaded into and executed by a machine such as a computer, the machine becomes an apparatus for practicing the disclosed methods. When implemented on a general-purpose processor, the program code is combined with the processor to provide a unique apparatus that operates analogously to application specific logic circuits.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A network searching method for overcoming crystal aging issue, the method comprising:
   searching network by invoking parameters stored in a first area of a volatile RAM;
   if the network searching is failed, searching network by invoking parameters stored in a second area of the volatile RAM;
   if the network searching is failed and the number of network searches is larger than a first predetermined value, reacquiring parameters and searching network with the reacquired parameters; and if the network searching is succeeded, updating the parameters in the first area with the reacquired parameters.

2. The network searching method of claim 1, wherein initial values of the parameters stored in the first area are the same as the parameters stored in the second area.

3. The network searching method of claim 1, wherein the parameters comprise a capacitance of a capacitance array and a capacitance of a varactor diode, and the capacitance of the capacitance array is changed for coarse tuning of the parameters; while the capacitance of the varactor diode is changed for fine tuning the parameters.

4. The network searching method of claim 3, wherein the step of reacquiring the parameters and searching the network comprises:
adjusting the capacitance of the capacitor array at a preset step and performing the network searching to minimize the frequency error; and
calibrating the capacitance of the varactor diode and performing the network searching so that the frequency error approaches zero.

5. The network searching method of claim 4, wherein the step of calibrating the capacitance of the varactor diode comprises:
adjusting the middle value of a variation range for the capacitance of the varactor diode to be located in the middle position of the variation range if a difference between the value of the capacitance of the varactor diode and the middle value of the variation range for the capacitance of the varactor diode has exceeded a predetermined range.

6. The network searching method of claim 1, wherein if searching the network by invoking the parameters stored in the second area of the volatile RAM is succeeded, the parameters of the first area are updated to the parameters of the second area.

7. A mobile terminal, comprising:
a first network searching module configured to search a network by invoking parameters stored in a first area of a volatile RAM;
a second network searching module connected to the first network searching module for searching the network by invoking parameters stored in a second area of the volatile RAM if the network searching is failed;
a third network searching module connected to the second network searching module for reacquiring parameters and searching the network if the network searching is failed and the number of network searches is larger than a first predetermined value; and
a parameter updating module connected to the third network searching module for updating the parameters in the first area with the reacquired parameters if the searching is succeeded.

8. The mobile terminal of claim 7, wherein initial values of the parameters stored in the first area are the same as the parameters stored in the second area.

9. The mobile terminal of claim 7, wherein the parameters comprise a capacitance of a capacitance array and a capacitance of a varactor diode, and the capacitance of the capacitance array is changed to perform coarse tuning of the parameters while the capacitance of the varactor diode is changed to perform fine tuning of the parameters.

10. The mobile terminal of claim 9, wherein the third network searching module is further configured to:
adjust the capacitance of the capacitor array at a preset step and perform the network searching to minimize the frequency error;
calibrate the capacitance of the varactor diode and perform the network searching so that the frequency error approaches zero.

11. The mobile terminal of claim 10, wherein the third network searching module is further configured to:
adjust the middle value of a variation range for the capacitance of the varactor diode to be located in the middle position of the variation range if a difference between the value of the capacitance of the varactor diode and the middle value of the variation range for the capacitance of the varactor diode has exceeded a predetermined range.

12. The mobile terminal of claim 7, wherein the parameter updating module is further configured to:
update the parameters of the first area to the parameters of the second area if searching the network by invoking the parameters stored in the second area of the volatile RAM is succeeded.

* * * * *